United States Patent [19]
Hutch

[11] 3,942,038
[45] Mar. 2, 1976

[54] THRESHOLD GATE HAVING A VARIABLE THRESHOLD LEVEL

[75] Inventor: Frederick S. Hutch, Warminster, Pa.

[73] Assignee: Honeywell Inc., Minneapolis, Minn.

[22] Filed: Nov. 21, 1974

[21] Appl. No.: 525,956

[52] U.S. Cl. .......................... 307/235 J; 307/235 F
[51] Int. Cl.² .......................................... H03K 5/20
[58] Field of Search ......... 307/235 R, 235 N, 235 J; 328/135, 146, 147

[56] References Cited
UNITED STATES PATENTS

| | | | |
|---|---|---|---|
| 3,585,510 | 6/1971 | O'Malley | 328/146 X |
| 3,733,498 | 5/1973 | Watson | 307/235 X |
| 3,804,979 | 4/1974 | Knowles | 328/147 X |

*Primary Examiner*—Paul L. Gensler
*Attorney, Agent, or Firm*—Arthur H. Swanson; Lockwood D. Burton; Mitchell J. Halista

[57] ABSTRACT

A threshold gate has a pair of signal comparators with each comparator being supplied with a first input signal derived from a subdivided portion of a respective polarity of a rectified form of an alternating current input signal. The comparators are also supplied directly with the alternating current input signal whereby the output signal of each comparator is the portion of the input signal above the variable threshold set by the rectified portion of the alternating current input signal.

4 Claims, 1 Drawing Figure

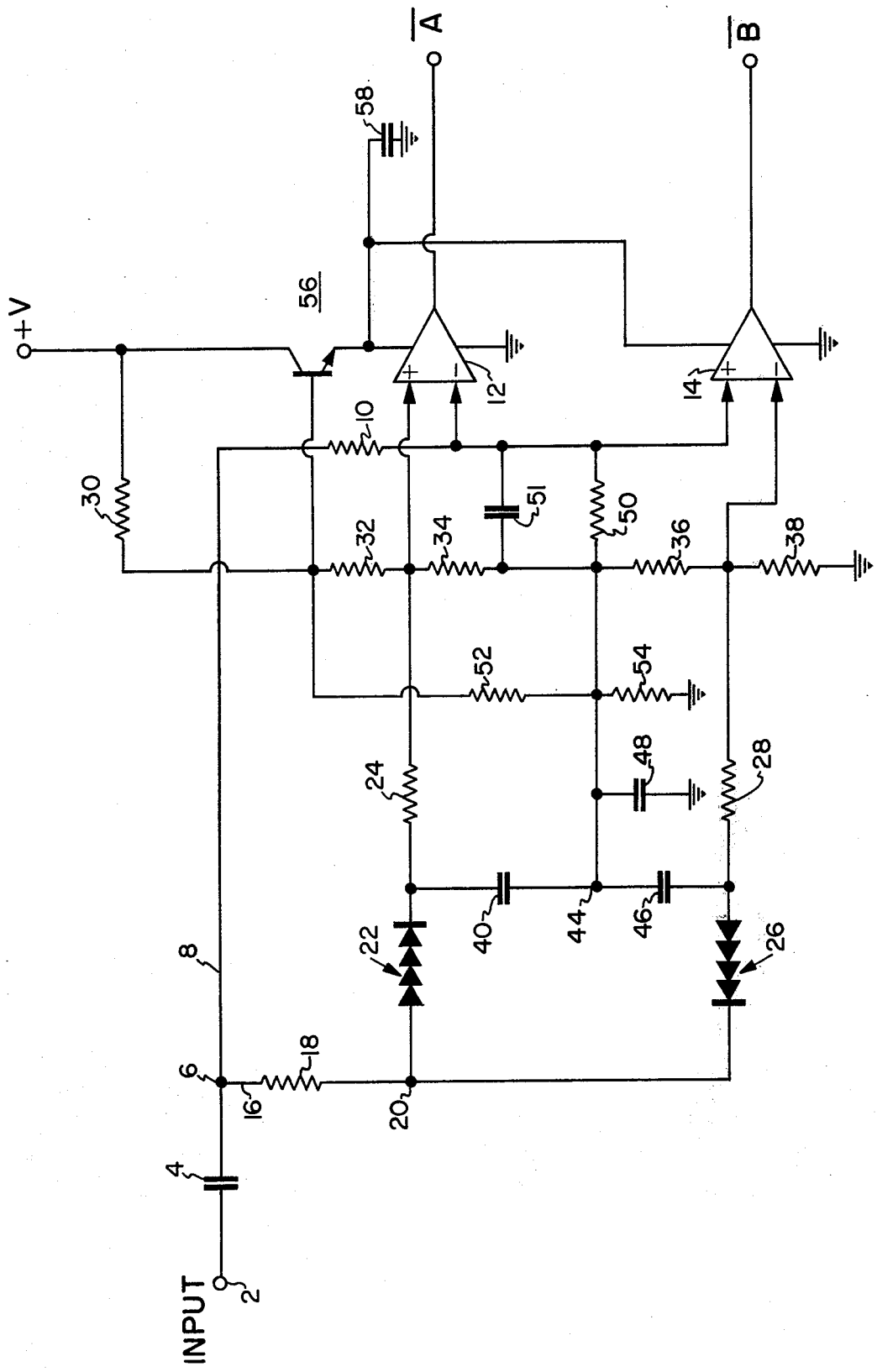

THRESHOLD GATE HAVING A VARIABLE THRESHOLD LEVEL

BACKGROUND OF THE INVENTION

1. Field of the Invention

The present invention is directed to threshold gates. More specifically, the present invention is directed to a threshold gate having a variable threshold level related to the amplitude of an input signal applied to the threshold gate.

2. Description of the Prior Art

In the field of data handling and process control, communication is often required between two remotely located transceiver devices connected to a common communication cable. In such a system, communication between nearby transceiver devices results in a high received signal level while between widely separated transceiver devices a low received signal level is common. Whatever the received signal level, communication between transceiver devices is most reliable when the receiver's input signal transmission gate threshold level is set at approximately one-half, i.e., 50 percent, of the signal level on the cable regardless of the actual signal level. The problem of a varying input signal is ordinarily handled by utilizing an automatic gain control circuit in front of the transmission gate which arrangement prevents the transmission gate from being affected by the signal variations on the cable. However such a prior art solution involves the use of a nonlinear device in the gain control circuit in order to provide automatic gain control adjustments which nonlinear devices can give rise to inaccuracies in the ultimate output signal from the transmission gate.

SUMMARY OF THE INVENTION

An object of the present invention is to provide an improved transmission gate for transmitting a predetermined portion of an input signal independently of the maximum amplitude of the input signal.

In accomplishing this and other objects, there has been provided, in accordance with the present invention, a threshold gate circuit having a first and a second signal comparator with respective polarities of a rectified alternating current input signal being supplied in a subdivided form to the first and second comparators as a first input signal thereto. A second input signal for the signal comparators is obtained directly from the alternating current input signal and after being subdivided is applied as a second input signal to both of the operational amplifiers to provide a signal to be amplified by the amplifiers above the threshold level set by the rectified input signals.

BRIEF DESCRIPTION OF THE DRAWING

A better understanding of the present invention may be had when the following detailed description is read in connection with the accompanying drawing in which the single FIGURE is a schematic illustration of a threshold gate circuit embodying the present invention.

DESCRIPTION OF THE PREFERRED EMBODIMENT

Detailed Description

Referring to the single FIGURE drawing in more detail, there is shown a threshold gate circuit embodying the present invention and having an input terminal 2 for connection to a source of an alternating current signal, e.g., a data transmission signal on an interconnecting data communication cable. The input terminal 2 is coupled by a coupling capacitor 4 to a first signal junction 6. A first output line 8 from the junction 6 is connected through a first resistor 10 to an inverting input terminal of a first signal comparator 12 and to a noninverting input terminal of a second comparator 14. A second output line 16 from the junction 6 is connected through a second resistor 18 to a second signal junction 20. A first diode element 22, which may be any suitable multipellet diode such as that manufactured by the General Electric Company and identified as MPD-400, is connected between the second junction 20 and one end of a third resistor 24. The other end of the third resistor 24 is connected to the non-inverting input of the first comparator 12. A second diode element 26 similar to the first diode element 22 is connected between the second junction 20 and one end of a fourth resistor 28 and is poled oppositely to the first diode element 22. The poling of the diode elements 22 and 26 is related to the connections thereof to the signal comparators 12 and 14 whereby the positive and negative polarities of the input signal are passed by the diode elements 22 and 26 to the appropriate ones of the amplifiers 12 and 14.

A plurality of resistors 30, 32, 34, 36 and 38 are used to provide voltage dividing operations for a source +V to supply a bias level signal to each of the amplifiers 12 and 14 and to divide the input signal before application to the comparators 12 and 14, as described hereinafter. The connection between the first diode element 22 and the third resistor 24 is connected by a first signal storage capacitor 40 to a third junction 44. Similarly, the connection between the second diode element 26 and the fourth resistor 28 is connected by a second storage capacitor 46 to the third junction 44. The third junction 44 is, in turn, connected by a first bypass capacitor 48 to a common, or ground, terminal and by a fifth resistor 50 to the noninverting input of the second comparator 14 and the inverting input of the first comparator 12. The fifth resistor 50 and the first resistor 10 form a voltage divider for the input signal applied thereto from the first junction 6 to produce a subdivided input signal for application to the comparators 12 and 14. Concurrently, a sixth and a seventh resistor 52 and 54 are connected in series with their junction being connected to the third junction 44 and one end of the sixth resistor 52 being connected to the voltage source +V by an eighth resistor 30. The other end of the seventh resistor 54 is connected to a ground material. Thus, the sixth resistor 54 functions as a ground return for the voltage dividing network formed by the resistors 10 and 50 and the voltage dividing network formed by the resistors 30 and 52.

The junction of the resistors 30 and 52 is connected to the base electrode of a transistor 56. The collector of the transistor 56 is connected to the source of voltage +V while the emitter is connected as an emitter follower to a source input of the first and second comparators 12 and 14. The transistor 56 acts as a voltage divider to step down the voltage from the source +V to the level required by the comparators 12 and 14. A bypass capacitor 58 is also connected to the emitter of transistor 56 to function as a conventional high frequency bypass to prevent oscillation of the comparators 12 and 14. Similarly, a bypass capacitor 51 is connected from the junction of resistors 10 and 50 to the bypass capacitor 48 to bypass any transit noise being supplied from the input 2 along with the data signals since this noise would be applied to the comparators 12 and 14 through the resistor 10.

A ninth resistor 34 is connected to the noninverting input of the first comparator 12 to form a voltage divider with the second resistor 24 for the input signal passed by the first diode element 22. Similarly, a tenth resistor 36 is connected from the inverting input of the second comparator 14 to form a voltage divider with the fourth resistor 28 for the signal passed by the second diode element 26. The output of the first comparator 12 is connected to a first output terminal $\overline{A}$ while the output of the second comparator 14 is connected to a second output terminal $\overline{B}$.

Finally, in order to prevent the comparators 12 and 14 from being sensitive to transient noise which may be present at the input terminal 2 during the absence of data signals, a bias signal is applied to the threshold level inputs of the comparators 12 and 14 to maintain their output signals in a quiescent state. This bias signal is obtained from another voltage divider using the resistors 30, 32, 34, 36 and 38. The junction between the resistors 32 and 34 is connected to the noninverting input of the first comparator 12 while the junction of the resistors 36 and 38 is connected to the inverting input of the second comparator 14. In other words, the bias level is superimposed on any data signal derived threshold level which may be applied to the comparators 12 and 14 and is applied between data signals to maintain a steady state output from the comparators 12 and 14. The level of the bias signal is selected to be below the lowest acceptable threshold level signal based on known signal levels applied to the input terminal 2 while maintaining a noninput signal threshold which will prevent spurious noise signal operation of the comparators 12 and 14.

MODE OF OPERATION

In operation, the threshold gate of the present invention is arranged to produce an output signal on either the first output terminal $\overline{A}$ or the second output terminal $\overline{B}$ depending on the polarity of the input signal applied to the input terminal 2. Further, the threshold gate is effective to produce an output signal only during the time when the input signal is above a predetermined threshold level. While a preferred threshold level would be at a 50 percent point of the maximum input signal amplitude, the circuit can be arranged to provide other threshold levels by an appropriate selection of the values of the resistors 24 and 34 for the first comparator 12 and resistors 28 and 36 for the second comparator 14 which resistor pairs divide the input signal from the input terminal 2. In the case of non-square-wave input signals applied to the input terminal 2, it may be necessary to select other than a 50 percent threshold level to provide an adequate pulse width of the output signal on the output terminals $\overline{A}$ and $\overline{B}$. As previously stated, the capacitors 48, 51 and 58 perform a signal bypass function to bypass radio frequency, RF, noise from the input signal applied to the input terminal 2 which noise signal might cause an unwanted triggering of the comparators 12 and 14 to produce an output signal on the output terminals $\overline{A}$ and $\overline{B}$.

The diodes 22 and 26 are each arranged to pass a respective polarity of the alternating current input signal applied to the input terminal 2. Specifically, diode 22 is poled to pass the positive polarity input signals while diode 26 passes the negative polarity input signals. In either case, the signal passed by the corresponding diode is applied to a respective one of the capacitors 40 and 46 to charge it to the peak amplitude of the input signal. Concurrently, the input signal is applied in subdivided form to a respective one of the comparators 12 and 14. Thus, the positive polarity input signal is subdivided by the resistors 24 and 34 to the 50 percent level and is applied to the noninverting input of the first comparator 12. Similarly, the negative polarity input signal is subdivided to the 50 percent level by the resistors 28 and 36 and is applied to the second comparator 14.

This subdivided form of the input signal is applied to the respective comparator as a threshold level against which the input signal will be monitored to produce an output signal from the threshold gate circuit. For example, the threshold signal from the dividing resistors 24 and 34 is applied to the first comparator 12 to maintain a positive output on the output of the comparator 12 until the input signal level is above this threshold level. The input signal, in turn, is subdivided by the resistors 10 and 50 to keep the input signal to the comparator 12 within its signal handling capability. During the interval between each positive input signal, e.g., an input signal having alternate positive and negative pulses is applied to the input terminal 2, the storage capacitor 40 starts to discharge through resistors 24 and 34. By selecting these resistors to have a total desired resistance, the discharge can be controlled to a desired level before the next positive pulse is applied thereto.

When the input signal applied to inverting input of the comparator 12 exceeds the threshold level applied to comparator 12, the output signal from the comparator changes polarity and remains at the new polarity for the duration of the time that the input signal remains above the threshold level. In other words, the positive threshold level applied to the noninverting input of the comparator 12 maintains a positive comparator output signal until the positive input signal applied to the inverting input of the comparator 12 exceeds the threshold level. Similarly, the negative input signal and negative threshold level at the input of the second comparator 14 maintain a positive output signal from the second comparator 14 until the negative input signal exceeds the negative threshold level. The discharging of storage capacitor 46 is controlled between negative input signals by the overall resistance of resistors 28 and 36.

Accordingly, it may be seen that there has been provided, in accordance with the present invention, a threshold gate circuit for passing a predetermined portion of an input signal independently of the actual amplitude of the input signal.

The embodiments of the invention in which an exclusive property or privilege is claimed are defined as follows:

1. A threshold gate circuit comprising
    a signal comparator means for comparing the amplitude of an input signal applied thereto with a threshold level and to produce an output signal having a duration determined by the time that the input signal exceeds the threshold level, said signal comparator means including a first comparator for comparing positive polarity input signals with a first threshold level and a second comparator for comparing negative polarity input signals with a second threshold level, input signal means connected to said signal comparator means to apply an input signal thereto, and
threshold level generating means connected between said input signal means and said comparator means to generate a threshold level for said signal comparator means which threshold level is a predetermined portion of the amplitude of said input signal, said threshold generating means including first means for generating said first threshold level and second means for generating said second threshold level.

2. A threshold gate as set forth in claim 1 wherein said first means includes a signal dividing means having an input and having an output connected to said first comparator and a first diode means poled to pass one polarity input signal and connected between said input of said first means and said input signal means and wherein said second means includes a signal dividing means having an input and having an output connected to said second comparator and a second diode means poled to pass another polarity of said input signals and connected between said input of said second means and said input signal means.

3. A threshold gate circuit as set forth in claim 1 wherein said threshold level generating means is a signal dividing means having an input connected to said input signal means and an output connected to said comparator means.

4. A threshold gate circuit as set forth in claim 3 wherein said threshold level generating means includes a bias signal means arranged to produce a continuous bias level for application to said comparator means as a threshold level.

* * * * *